United States Patent
Manning et al.

(10) Patent No.: US 8,519,463 B2
(45) Date of Patent: Aug. 27, 2013

(54) SEMICONDUCTOR CONSTRUCTIONS CONTAINING TUBULAR CAPACITOR STORAGE NODES, AND RETAINING STRUCTURES ALONG PORTIONS OF THE TUBULAR CAPACITOR STORAGE NODES

(75) Inventors: H. Montgomery Manning, Eagle, ID (US); Thomas M. Graettinger, Boise, ID (US)

(73) Assignee: Micron Technology, Inc., Boise, ID (US)

(*) Notice: Subject to any disclaimer, the term of this patent is extended or adjusted under 35 U.S.C. 154(b) by 4 days.

(21) Appl. No.: 13/413,552

(22) Filed: Mar. 6, 2012

(65) Prior Publication Data
US 2012/0168903 A1 Jul. 5, 2012

Related U.S. Application Data

(60) Division of application No. 12/853,948, filed on Aug. 10, 2010, now Pat. No. 8,154,064, which is a continuation of application No. 11/595,436, filed on Nov. 9, 2006, now Pat. No. 7,781,818, which is a division of application No. 11/215,243, filed on Aug. 30, 2005, now Pat. No. 7,226,845.

(51) Int. Cl.
*H01L 27/108* (2006.01)
*H01L 29/94* (2006.01)

(52) U.S. Cl.
USPC .......... 257/304; 257/305; 257/E27.048; 438/386

(58) Field of Classification Search
USPC .......... 257/296, 304, E27.048, E21.019, 257/E27.014; 438/386
See application file for complete search history.

(56) References Cited

U.S. PATENT DOCUMENTS

| | | | |
|---|---|---|---|
| 5,821,141 A | 10/1998 | Huang | |
| 5,918,122 A | 6/1999 | Parekh et al. | |
| 6,083,831 A | 7/2000 | Dennison | |
| 6,140,172 A | 10/2000 | Parekh | |
| 6,180,485 B1 | 1/2001 | Parekh et al. | |
| 6,207,523 B1 | 3/2001 | Parekh et al. | |
| 6,214,727 B1 | 4/2001 | Parekh et al. | |
| 6,228,738 B1 | 5/2001 | Parekh et al. | |
| 6,232,176 B1 | 5/2001 | Parekh et al. | |

(Continued)

OTHER PUBLICATIONS

Kim et al., "A Mechanically Enhanced Storage node for virtually unlimited Height (MESH) Capacitor Aiming at sub 70 nm DRAMs", IEEE, 2004, pp. 3.4.1-3.4.4.

*Primary Examiner* — Jarrett Stark
(74) *Attorney, Agent, or Firm* — Wells St. John P.S.

(57) ABSTRACT

The invention includes semiconductor constructions, and also includes methods of forming pluralities of capacitor devices. An exemplary method of the invention includes forming conductive storage node material within openings in an insulative material to form conductive containers. A retaining structure lattice is formed in physical contact with at least some of the containers, and subsequently the insulative material is removed to expose outer surfaces of the containers. The retaining structure can alleviate toppling or other loss of structural integrity of the container structures. The electrically conductive containers correspond to first capacitor electrodes. After the outer sidewalls of the containers are exposed, dielectric material is formed within the containers and along the exposed outer sidewalls. Subsequently, a second capacitor electrode is formed over the dielectric material. The first and second capacitor electrodes, together with the dielectric material, form a plurality of capacitor devices.

20 Claims, 13 Drawing Sheets

(56) References Cited

U.S. PATENT DOCUMENTS

| | | |
|---|---|---|
| 6,238,971 B1 | 5/2001 | Parekh et al. |
| 6,703,657 B2 | 3/2004 | Hwang et al. |
| 7,125,781 B2 | 10/2006 | Manning et al. |
| 7,226,845 B2 | 6/2007 | Manning et al. |
| 2001/0012223 A1 | 8/2001 | Kohyama |
| 2001/0021552 A1 | 9/2001 | Parekh et al. |
| 2003/0132429 A1 | 7/2003 | Kim et al. |
| 2004/0164338 A1 | 8/2004 | Koyama |
| 2005/0051822 A1 | 3/2005 | Manning |
| 2005/0054159 A1 | 3/2005 | Manning et al. |
| 2005/0287780 A1 | 12/2005 | Manning et al. |
| 2006/0263971 A1 | 11/2006 | Lee et al. |

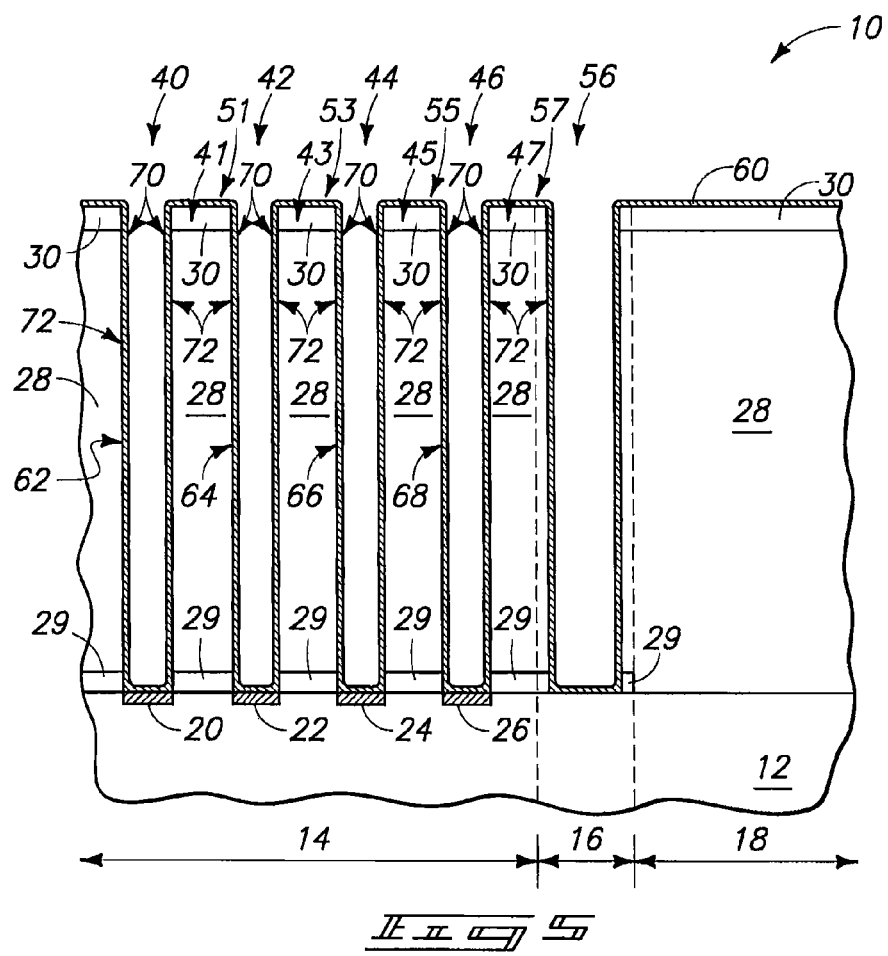
_FIG. 5_
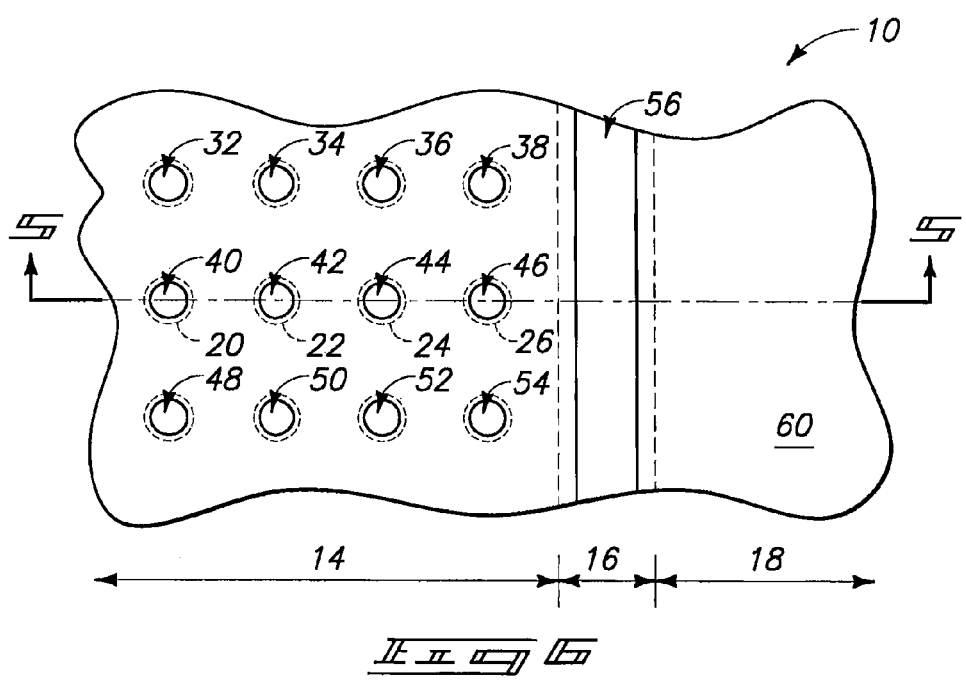
_FIG. 6_

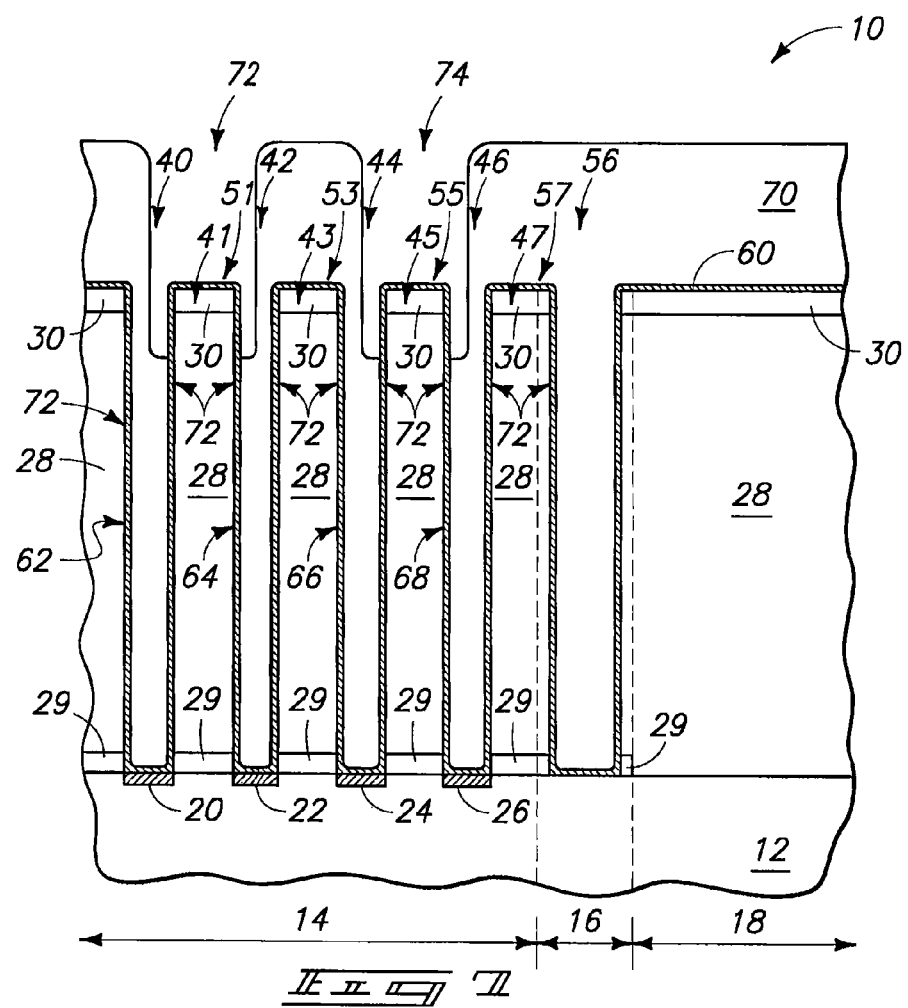
_FIG. 7_
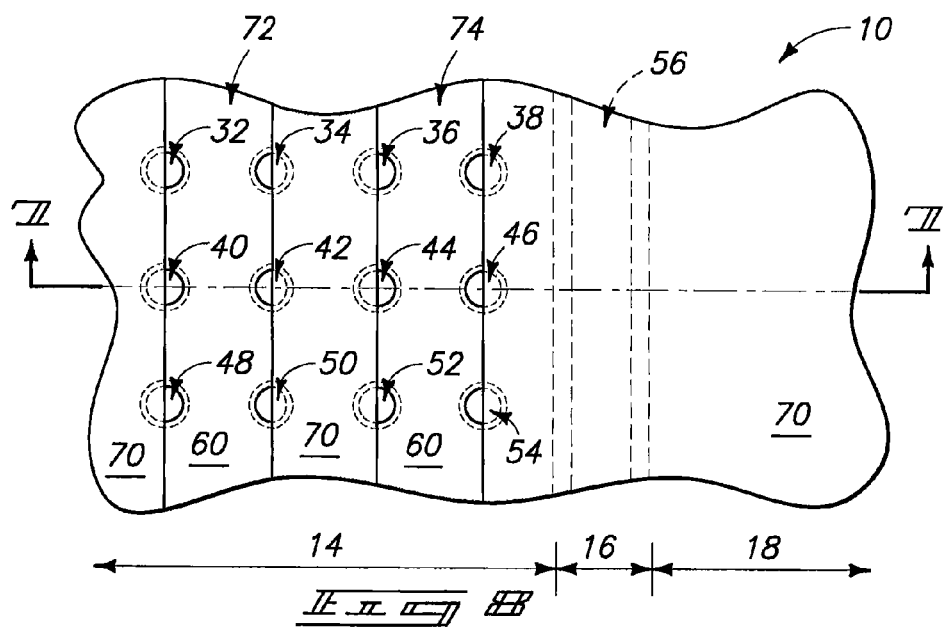
_FIG. 8_

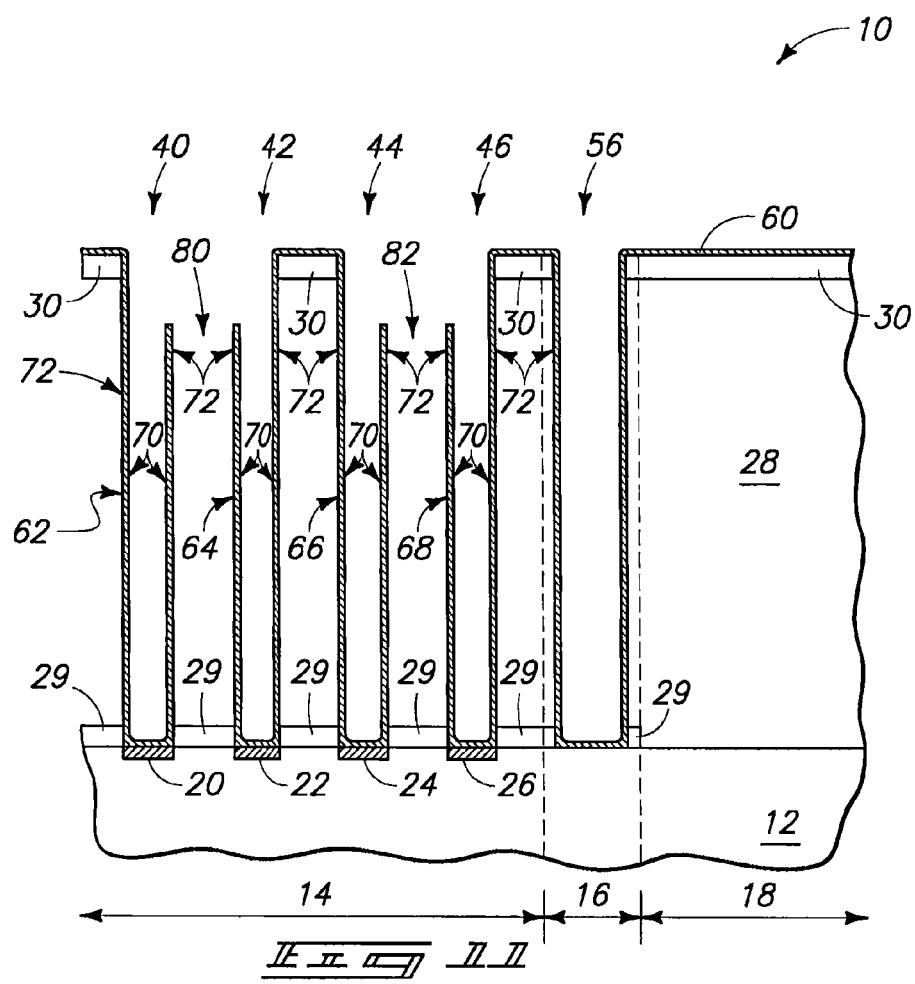
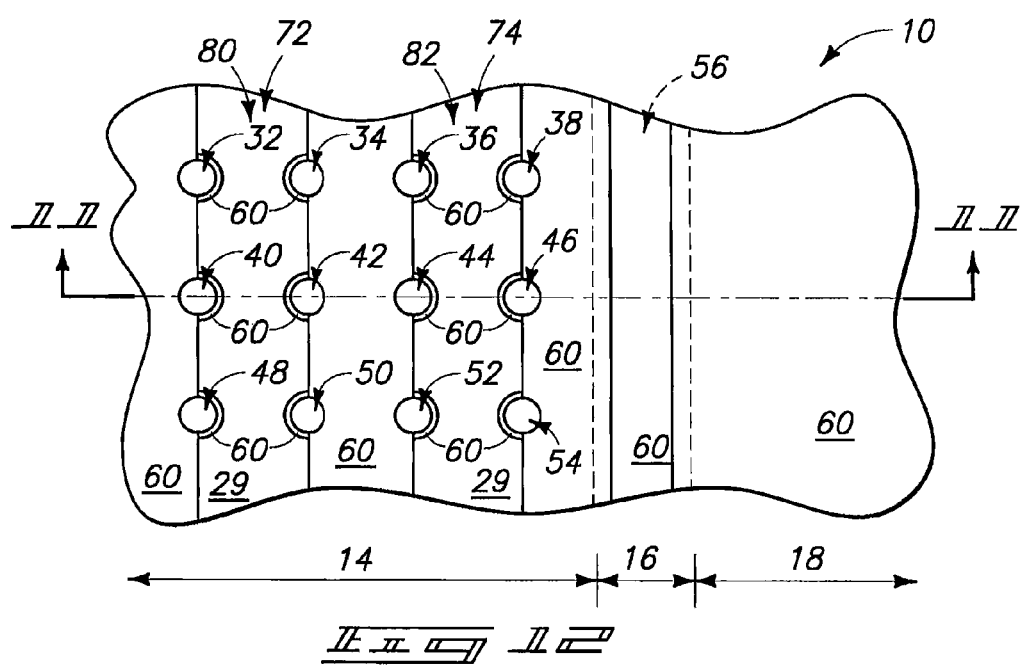

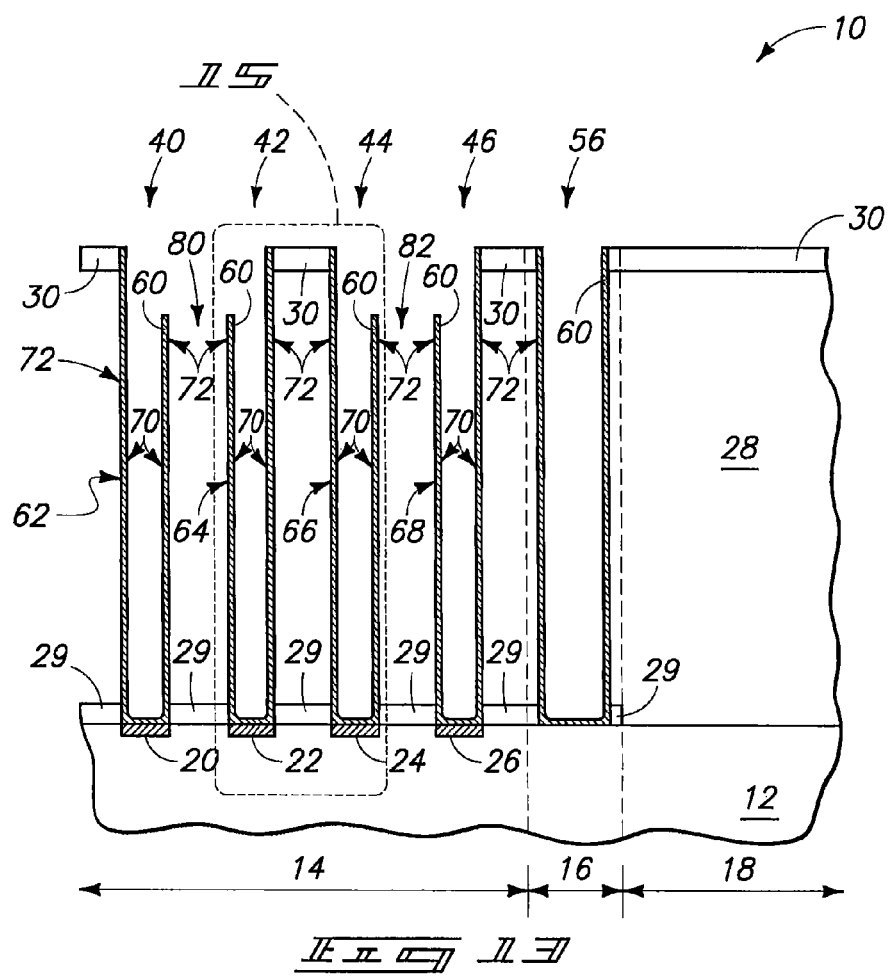
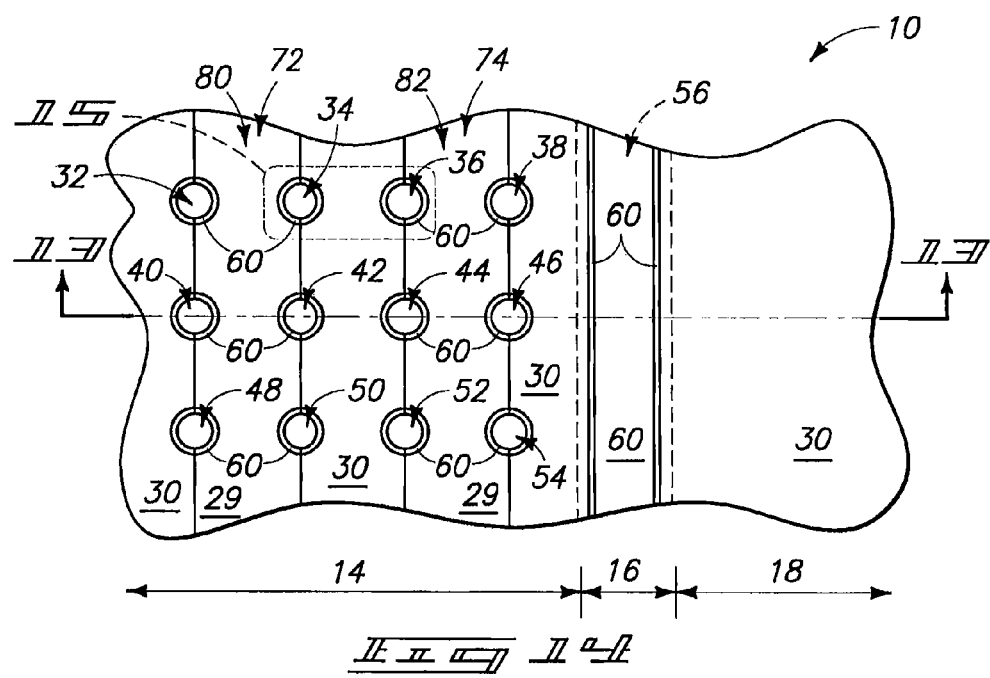

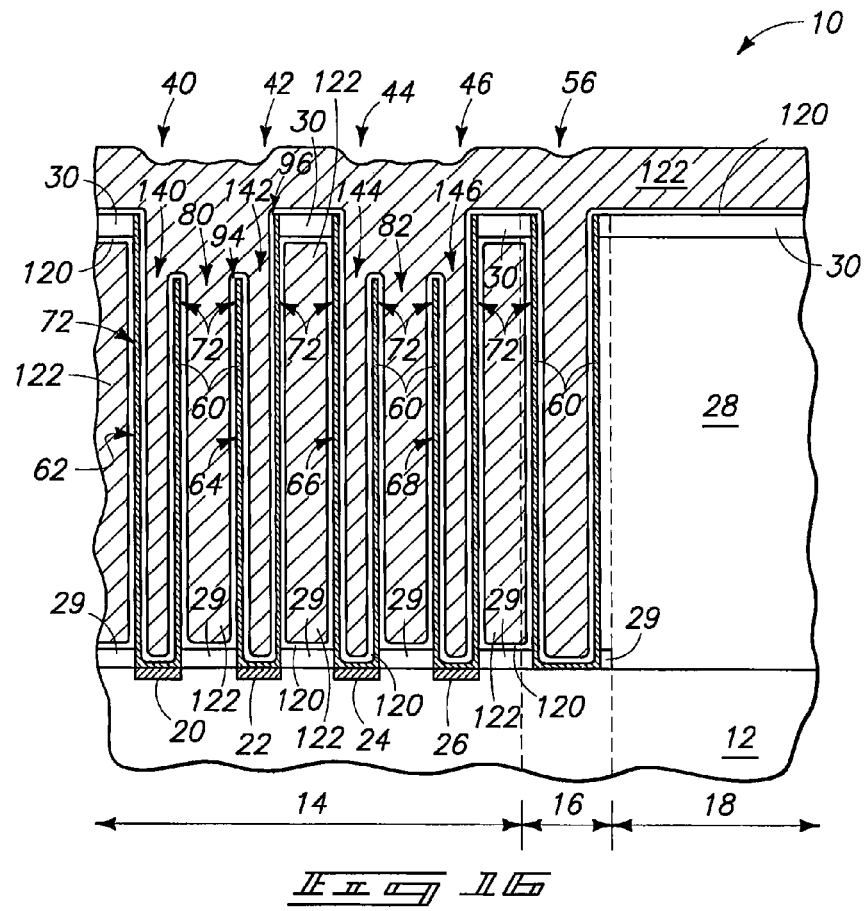
_FIG. 16_
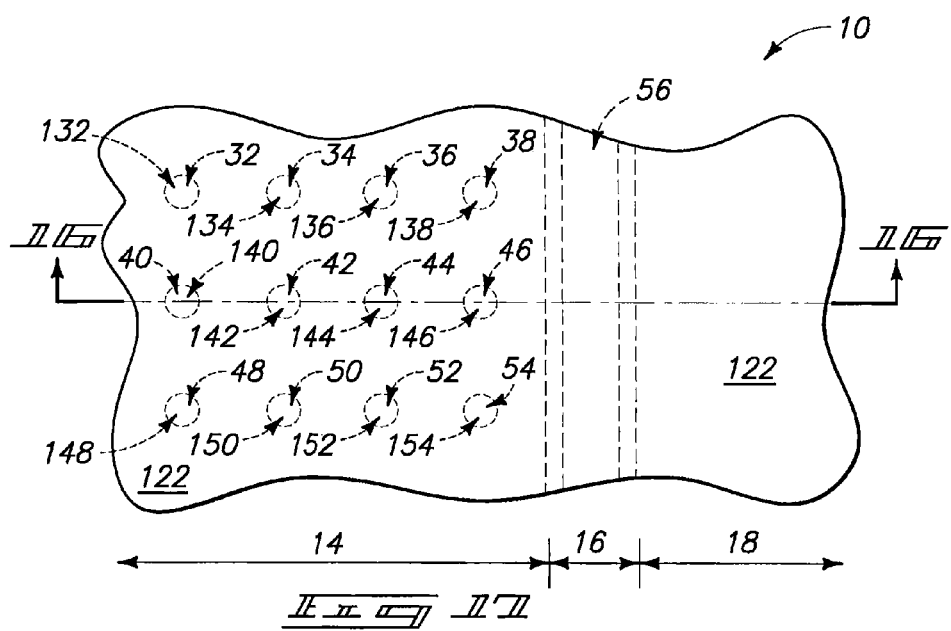
_FIG. 17_

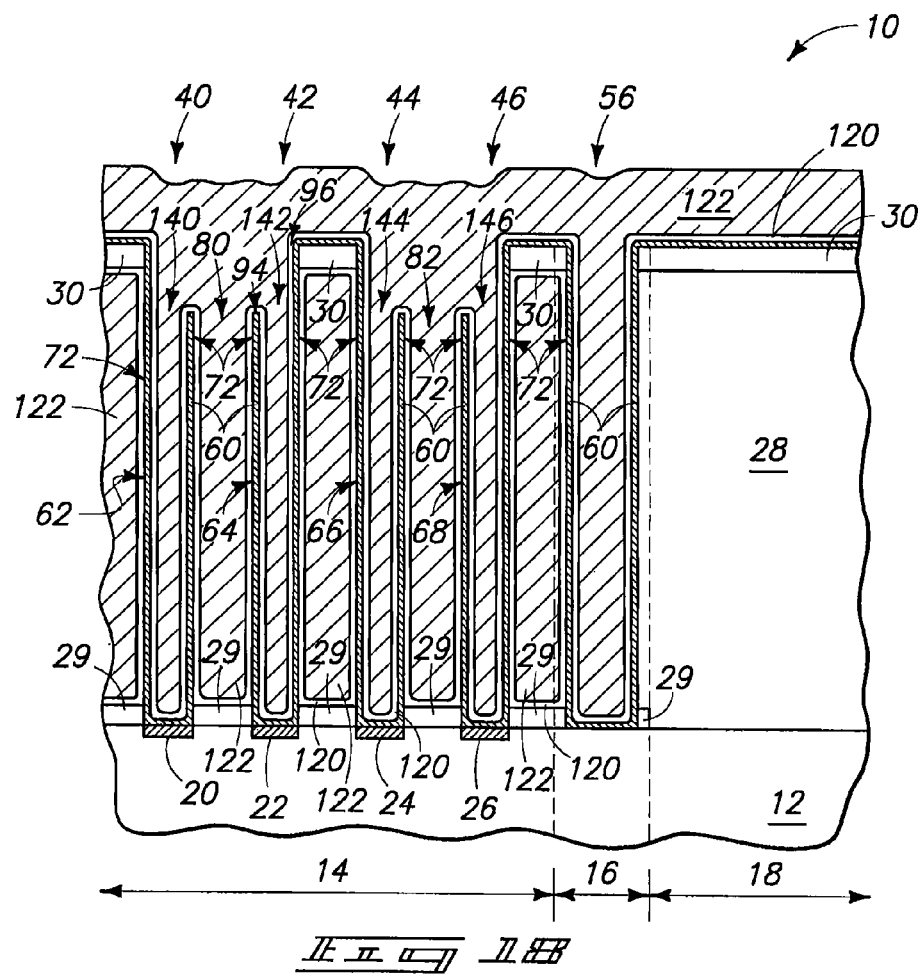
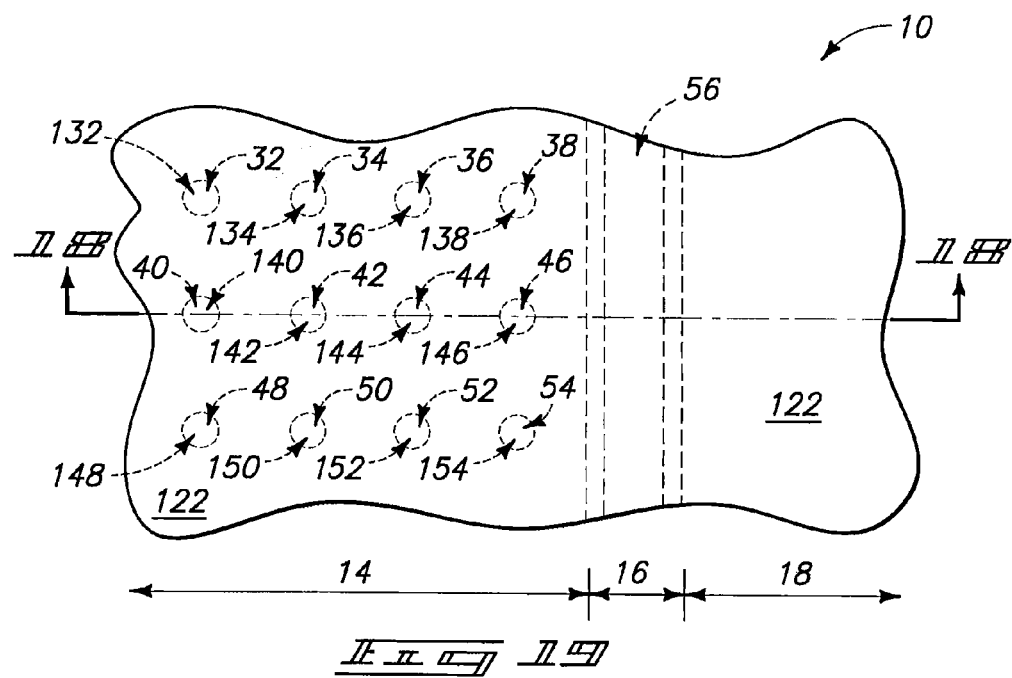

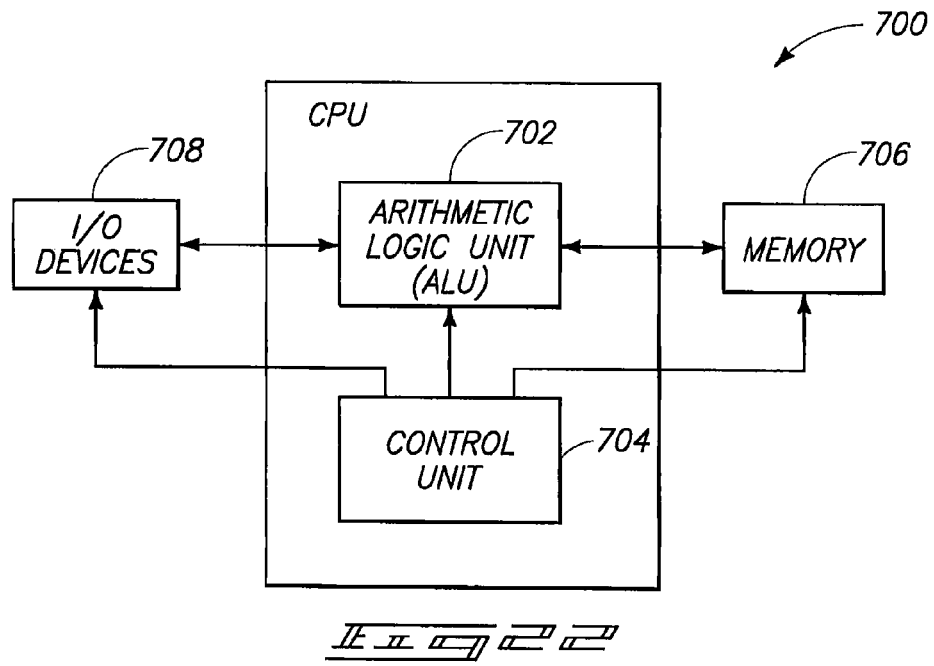
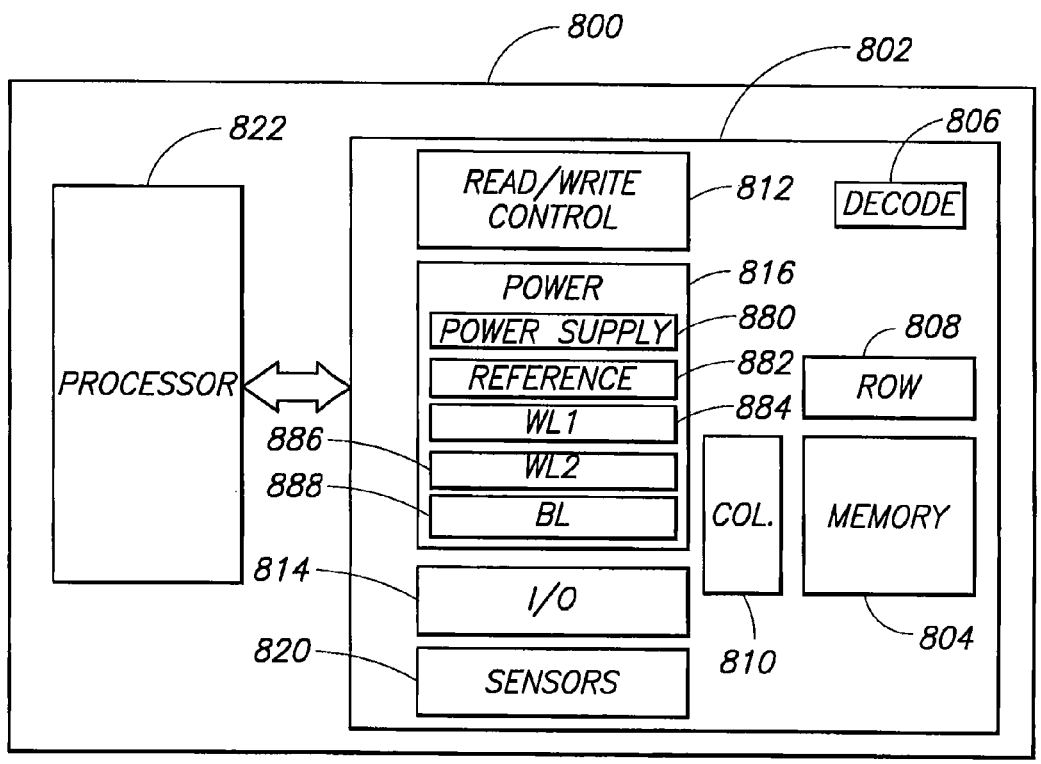

SEMICONDUCTOR CONSTRUCTIONS CONTAINING TUBULAR CAPACITOR STORAGE NODES, AND RETAINING STRUCTURES ALONG PORTIONS OF THE TUBULAR CAPACITOR STORAGE NODES

CROSS REFERENCE TO RELATED APPLICATION

This application is a divisional of U.S. application Ser. No. 12/853,948, which was filed on Aug. 10, 2010; which is a continuation of U.S. patent application Ser. No. 11/595,436, which was filed on Nov. 9, 2006, now U.S. Pat. No. 7,781,818; and which is a divisional application of U.S. patent application Ser. No. 11/215,243, which was filed Aug. 30, 2005, now U.S. Pat. No. 7,226,845; and all of these listed priority applications are hereby incorporated herein by reference.

RELATED PATENT DATA

Technical Field

The invention pertains to semiconductor constructions, and to methods of forming capacitor devices.

BACKGROUND OF THE INVENTION

Capacitor constructions continue to have increasing aspect ratios in higher generation integrated circuitry fabrication. For example, dynamic random access memory (DRAM) capacitors now have elevations of from 2 to 3 microns, with widths of about 0.1 micron. Further, it is a continuing goal to increase the density of semiconductor devices, with a corresponding goal to reduce the footprint associated with individual devices. As the packing density of capacitor devices becomes increasingly greater, the available surface area for capacitance decreases.

A common capacitor construction is a so-called container device. One of the electrodes of such device is shaped as a container, and subsequently dielectric material and another capacitor electrode are formed within the container. Typically, only the interior surfaces of the containers are being utilized for capacitance surface area. It would be desirable to utilize exterior surfaces of the containers for capacitance as well. Unfortunately, exposure of both the interior and exterior surfaces of a container having a high aspect ratio can render the container structurally weak, and subject to toppling or breaking from an underlying base. It would therefore be desirable to develop methods which enable exterior surfaces of high aspect ratio containers to be utilized as capacitive surfaces while avoiding toppling or other loss of structural integrity of the high aspect ratio containers.

Another type of capacitor structure is a so-called pedestal (or post) device. One of the electrodes of the device is shaped as a pedestal, and subsequently dielectric material and another capacitor electrode are formed over and around the pedestal. If the pedestal is tall and thin, it can be structurally weak and subject to toppling or breaking from an underlying base. It would therefore be desirable to develop methods which avoiding toppling or other loss of structural integrity of pedestals.

Although the invention is, at least in part, motivated by the problems discussed above, it is to be understood that the invention can have applications beyond the addressing of such problems.

SUMMARY OF THE INVENTION

In one aspect, the invention includes a method of forming a plurality of capacitor devices. An assembly is provided which comprises a semiconductor substrate supporting a plurality of electrical nodes, a first material over the substrate and nodes, and a second material over the first material. Openings are formed to extend through the first and second materials to the nodes. Conductive materials are formed within the openings and over the second material. Some of the conductive material and second material are removed to form apertures extending through the conductive and second materials to the first material. The first material is etched through the apertures with an etch selective for the first material relative to the second material and the conductive material, and the conductive material is then incorporated into a plurality of capacitor devices.

In one aspect, the invention includes another method of forming a plurality of capacitor devices. An assembly is provided which comprises a semiconductor substrate supporting a plurality of electrical nodes, an etch stop material over the substrate, a first material over the etch stop material, and an electrically insulative retaining material over the first material. Openings are formed to extend through the retaining material, etch stop material, and first material to the electrical nodes. The openings are spaced from one another by segments of the retaining material. Conductive capacitor electrode material is formed within the openings. At least some of the segments are removed to form apertures to the first material. At least some of the first material is etched through the apertures with an isotropic etch selective for the first material relative to the etch stop material and the retaining material. After the etching, the conductive capacitor electrode material is incorporated into a plurality of capacitor devices.

In one aspect, the invention includes yet another method of forming a plurality of capacitor devices. A construction is provided which comprises a first material over a substrate, and a retaining structure over the first material. Openings are formed to extend through the retaining structure and into the first material. The openings are in an array comprising rows and columns. A first conductive layer is formed within the openings and over the retaining structure. The first conductive layer within the openings forms container structures having outer sidewalls along the first material. The container structures are formed in the array defined by the openings, and thus the container structures are within an array comprising rows and columns. Portions of the retaining structure and the first conductive layer are removed so that remaining portions of the retaining structure and the first conductive layer extend between and connect alternating pairs of the rows of the container structure array. The removal of the portions of the retaining structure and the first conductive layer form windows to the first material. The first material is removed through the windows to expose at least portions of the outer sidewalls of the container structures. A capacitor dielectric material is formed along the exposed portions of the outer sidewalls and within the container structures. A second conductive layer is formed over the capacitor dielectric material.

In one aspect, the invention includes a semiconductor construction. The construction comprises a semiconductor substrate and a capacitor storage node supported by the substrate. The storage node has a first end proximate the substrate and a second end in opposing relation to the first end. The second end has an upper portion, a lower portion below the upper portion, and a step connecting the upper and lower portions to one another. The semiconductor construction further includes a retaining structure against the upper portion of the second end of the storage node, and not against the lower portion of such second end. Further, the semiconductor construction includes a dielectric material along the storage node, and an electrically conductive material over the dielectric material and capacitively connected with the storage node.

In one aspect, the invention includes a semiconductor construction comprising a semiconductor substrate and a plurality of capacitor storage nodes supported by the substrate. Individual storage nodes are shaped as hollow tubes extending upwardly from the substrate. The tubes have first ends proximate the substrate and second ends in opposing relation to the first ends. The second ends have upper portions, lower portions below the upper portions, and steps connecting the upper and lower portions to one another. The tubes have inner surfaces along their interiors and outer surfaces along their exteriors. The tubes extend in an array comprising rows and columns. The semiconductor construction further comprises retaining structures against the upper portions of the second ends and not against the lower portions of the second ends. The retaining structures extend between and connect alternating pairs of the rows of storage nodes of the array. Further, the construction includes a dielectric material along the inner and outer surfaces of the tubes, and an electrically conductive material over the dielectric material and capacitively connected with the storage nodes.

BRIEF DESCRIPTION OF THE DRAWINGS

Preferred embodiments of the invention are described below with reference to the following accompanying drawings.

FIG. 5 shows the FIG. 1 wafer fragment at a processing stage subsequent to that of FIG. 3.

FIG. 6 is a top view of a semiconductor construction comprising the fragment of FIG. 5 along the line 5-5.

FIG. 7 shows the FIG. 1 wafer fragment at a processing stage subsequent to that of FIG. 5.

FIG. 8 is a top view of a semiconductor wafer fragment comprising the cross-section of FIG. 7 along the line 7-7.

FIG. 11 shows the FIG. 1 wafer fragment at a processing stage subsequent to that of FIG. 9.

FIG. 12 is a top view of a semiconductor wafer fragment comprising the cross-section of FIG. 11 along the line 11-11.

FIG. 13 shows the FIG. 1 wafer fragment at a processing stage subsequent to that of FIG. 11.

FIG. 14 is a top view of a semiconductor wafer fragment comprising the cross-section of FIG. 13 along the line 13-13.

FIG. 16 shows the FIG. 1 wafer fragment at a processing stage subsequent to that of FIG. 13.

FIG. 17 is a top view of a semiconductor wafer fragment comprising the cross-section of FIG. 16 along the line 16-16.

FIG. 18 shows the FIG. 1 wafer fragment at a processing stage subsequent to that of FIG. 11 in accordance with an aspect of the invention alternative to that of FIG. 13.

FIG. 19 is a top view of a semiconductor wafer fragment comprising the cross-section of FIG. 18 along the line 18-18.

FIG. 22 is a diagrammatic view of a computer illustrating an exemplary application of the present invention.

FIG. 23 is a block diagram showing particular features of the motherboard of the FIG. 22 computer.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention includes methodology for forming capacitor constructions in which a retaining structure, or lattice, is utilized to hold capacitor electrode structures (such as containers or pedestals) as outer sidewalls of the capacitor electrode structures are exposed with an etch. The retaining structure can thus alleviate, and preferably prevent, toppling and other structural defects occurring to the capacitor electrode structures as the outer surfaces of the structures are exposed. The capacitor electrode structures can be storage node structures.

A particular aspect of the invention includes methodology for forming container capacitor constructions in which a retaining structure, or lattice, is utilized to hold conductive containers as outer sidewalls of the containers are exposed with an etch. The retaining structure can thus alleviate, and preferably prevent, toppling and other structural defects occurring to the containers as the outer surfaces of the containers are exposed. The lattice utilized to retain the containers is rigid enough to provide support for the containers, but also has holes, or grooves, patterned into it to allow wet or gaseous removal of material from adjacent the containers, which ultimately exposes outer surfaces of the containers. The removal of material from adjacent the containers can be accomplished using an isotropic etch.

In typical processing, a semiconductor wafer will have one region corresponding to a memory array, and another region peripheral to the memory array in which logic or other circuitry is to be formed. Methodology of the present invention can form the retaining lattice over the memory array, while utilizing the same material as that utilized in the lattice to form a protective layer over the peripheral region to protect the peripheral region from the etch utilized to expose outer surfaces of capacitor electrode structures in the memory array. Additionally, material utilized for fabrication of capacitor storage nodes can extend over and protect the peripheral region during the etch utilized to expose outer surfaces of capacitor electrode structures in the memory array. The invention can also include formation of a trench in a location between the memory array region and the peripheral region, and provision of a protective material within the trench which protects a lateral periphery of the peripheral region from attack by etchants utilized to remove material from the memory array region during exposure of outer surfaces of the capacitor electrode structures.

Various aspects of the invention are described below with reference to FIGS. 1-25.

Figure 1:
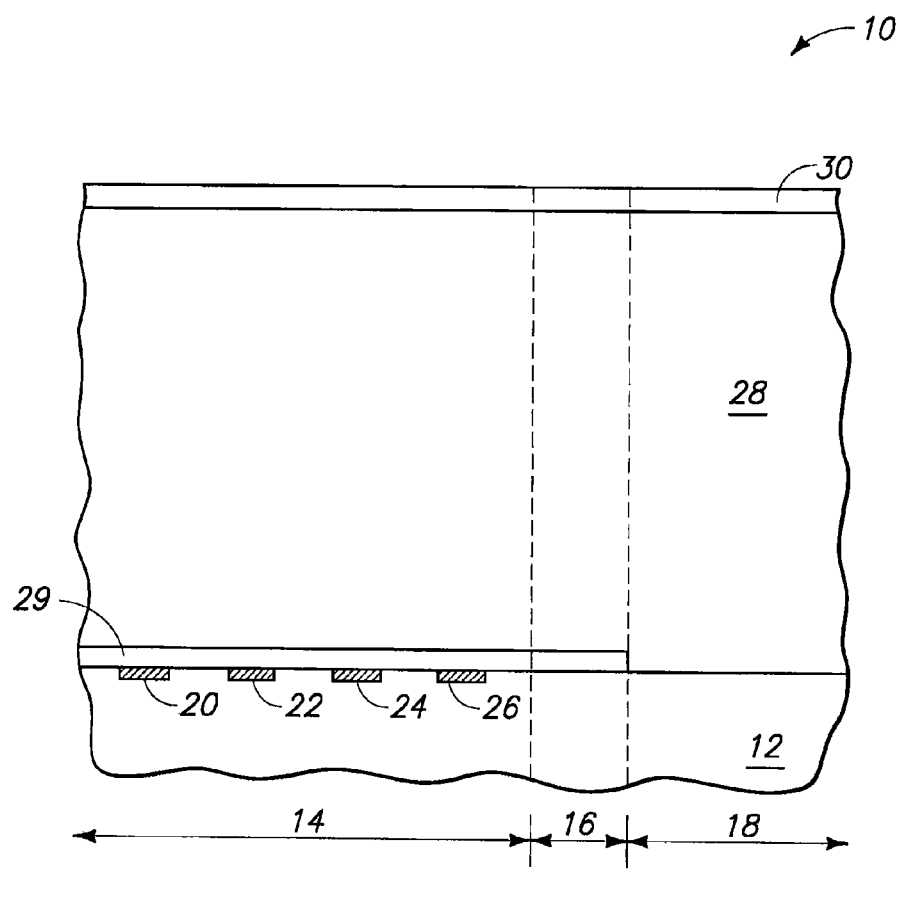
FIG. 1 is a diagrammatic, cross-sectional view of a semiconductor wafer fragment at a preliminary processing stage of an exemplary aspect of the present invention.

Referring initially to FIG. 1, a semiconductor wafer fragment 10 is shown at a preliminary processing stage of an exemplary aspect of the present invention. Fragment 10 comprises a substrate 12. Substrate 12 can comprise, consist essentially of, or consist of, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 is divided into three defined regions 14, 16 and 18. Region 14 corresponds to a memory array region. Region 18 corresponds to a region other than the memory array region, and can correspond to, for example, a so-called peripheral region. The region is referred to as a peripheral region because it is peripheral to the memory array region. Typically, logic circuitry and other circuitry associated with the control of data flow to and from memory devices associated with memory array region 14 would be associated with peripheral region 18. Region 16 corresponds to a location between the memory array region 14 and the peripheral region 18. Dashed lines are provided through construction 10 to demarcate the various defined regions 14, 16 and 18 extending within the structure. Various circuit devices (not shown) could be associated with one or more of the regions 14, 16 and 18 at the processing stage of FIG. 1.

A plurality of electrically conductive node locations 20, 22, 24 and 26 are shown within the memory array region 14 of substrate 12. Node locations 20, 22, 24 and 26 can correspond to, for example, conductively-doped diffusion regions within a semiconductive material of substrate 12, and/or to conductive pedestals associated with substrate 12. Although the node locations are shown to be electrically conductive at the processing stage of FIG. 1, it is to be understood that the electrically conductive materials of the node locations could be provided at a processing stage subsequent to that of FIG. 1 in various other aspects of the invention (not shown). Node locations 20, 22, 24 and 26 can ultimately be electrically connected with transistor constructions (not shown in FIG. 1) and can correspond to source/drain regions of the transistor constructions, or can be ohmically connected to source/drain regions of the transistor constructions. Transistor gates and other components of the transistor constructions can be present within memory array region 14 at the processing stage of FIG. 1, or can be formed in subsequent processing.

A material 29 is formed over substrate 12, and a material 28 is formed over the material 29. Material 29 can comprise a single homogeneous layer (as shown), or can comprise multiple layers of differing composition and/or physical properties. Material 29 will typically comprise, consist essentially of, or consist of one or more electrically insulative materials. In particular aspects, material 29 will comprise, consist essentially of, or consist of one or both of undoped silicate glass (USG) and silicon nitride. If material 29 comprises only undoped silicate glass, the material 29 can be considered to consist essentially of, or consist of, silicon dioxide. In subsequent processing, discussed below, material 28 is selectively etched relative to material 29. Accordingly, material 29 can be referred to as an etch stop material.

Material 29 is shown extending across regions 14 and 16, and not across region 18. It is to be understood, however, that the invention also includes aspects in which material 29 extends across all of the regions 14, 16 and 18; does not extend across region 16; or extends only partially across one or more of the regions 14, 16 and 18.

Material 29 can have any suitable thickness, and in some aspects will have a thickness of from about 100 Å to about 2000 Å. It can be advantageous to utilized undoped silicate glass for material 29, as compared to silicon nitride, in that undoped silicate glass can better adhere to some of the compositions utilized in various aspects of the invention (for instance, titanium and titanium nitride) than does silicon nitride. Also, the silicon nitride will frequently be so thin (for example, from about 100 Å to about 500 Å) that pinholes, cracking and other defects of the nitride can be difficult to avoid. However, silicon nitride can provide advantages in that etch selectivity for materials of material 28 can be greater relative to silicon nitride than relative to undoped silicate glass. Thus, it can be advantageous to utilize both silicon nitride and undoped silicon glass in material 29.

If both silicon nitride and undoped silicate glass are used in material 29, the silicon nitride can be either over or under the undoped silicate glass. In some aspects, the material 29 will comprise a sandwich structure in which a layer of silicon nitride is between a pair of undoped silicate glass layers.

Material 28 can comprise a single homogeneous layer (as shown), or can comprise multiple layers of differing composition and/or physical properties. Material 28 can comprise, consist essentially of, or consist of one or more electrically insulative materials. In particular aspects, material 28 will comprise, consist essentially of, or consist of one or more of borophosphosilicate glass (BPSG), spin-on-glass (SOG), silicon dioxide, phosphosilicate glass (PSG), borosilicate glass (BSG) and undoped glass. In some aspects, material 28 will comprise, consist essentially of, or consist of silicon and oxygen. Material 28 can have a thickness over material 29 of, for example, from about 5,000 Å to about 50,000 Å, and typically will have a thickness of about 20,000 Å.

The materials 28 and 29 together have a combined total thickness, and material 29 will typically have a thickness that is less than or equal to about 10% of such combined total thickness.

If material 28 comprises doped silicate glass and material 29 comprises undoped silicate glass, the materials 28 and 29 can be formed in continuous processing. Specifically, material 29 can be formed during deposition of silicate glass in the absence of dopant, and subsequently dopant can be flowed into the deposition process to form the material 28. The process can be considered to be continuous if silicate glass formation is not interrupted between the formation of material 29 and the formation of material 28. Such continuous processing will typically form a dopant gradient interface transition from material 29 to material 28.

In aspects in which material 29 comprises both silicon nitride and undoped silicate glass, it can be advantageous to form the undoped silicate glass over the silicon nitride so that the above-described continuous processing can be utilized to transition from formation of material 29 to formation of material 28.

A retaining structure (also referred to as a lattice structure) 30 is formed over material 28. Retaining structure 30 can comprise a single homogeneous composition, or can comprise two or more layers of differing composition. In subsequent processing (described below) at least some of material 28 is selectively etched relative to at least some of retaining material 30. Accordingly, retaining material 30 preferably comprises a composition to which at least some of material 28 can be selectively etched. For purposes of interpreting this disclosure and the claims that follow, a first material is considered to be selectively etched relative to a second material if the first material is etched at a faster rate than the second material, which can include, but is not limited to, etches 100% selective for the first material relative to the second material.

In particular aspects, material 28 can be considered to comprise a first material, and structure 30 can be considered to comprise a second material to which the first material is ultimately selectively etched. In some aspects, retaining structure 30 will comprise, consist essentially of, or consist of silicon and nitrogen. In an exemplary aspect, material 28 will comprise, consist essentially of, or consist of borophosphosilicate glass and retaining structure 30 will comprise, consist essentially of, or consist of silicon nitride. In another exemplary aspect, material 28 will comprise, consist essentially of, or consist of doped or undoped silicon-containing glass and composition 30 will comprise one or more layers consisting essentially of, or consisting of silicon nitride; together with one or more layers consisting essentially of, or consisting of silicon. The layers consisting essentially of silicon, or consisting of silicon, can comprise amorphous silicon and/or polycrystalline silicon.

If retaining structure 30 consists essentially of, or consists of silicon nitride, the structure can have a thickness of from about 50 Å to about 3,000 Å, and typically will have a thickness of about 700 Å. If structure 30 comprises a stack of layers of silicon nitride and silicon; the layers of silicon nitride can have a thickness of from about 50 Å to about 3,000 Å, with a typical thickness being about 300 Å; and the layers of silicon can have a thickness of from about 50 Å to about 1,000 Å, with a typical thickness being about 200 Å. In particular aspects, structure 30 can comprise a layer consisting essentially of, or consisting of silicon nitride sandwiched between a pair of layers consisting essentially of, or consisting of silicon. In such aspects, the layers of silicon can have thicknesses of from about 50 Å to about 500 Å, with a typical thickness being about 200 Å; and the middle layer of silicon nitride can have a thickness of from about 50 Å to about 1,000 Å, with a typical thickness being about 300 Å.

The material 28, retaining structure 30 and material 29 can be referred to as first, second and third materials, respectively. The combination of the substrate with one or more of such first, second and third materials can be referred to as assembly in the discussion and claims that follow.

Figure 2:
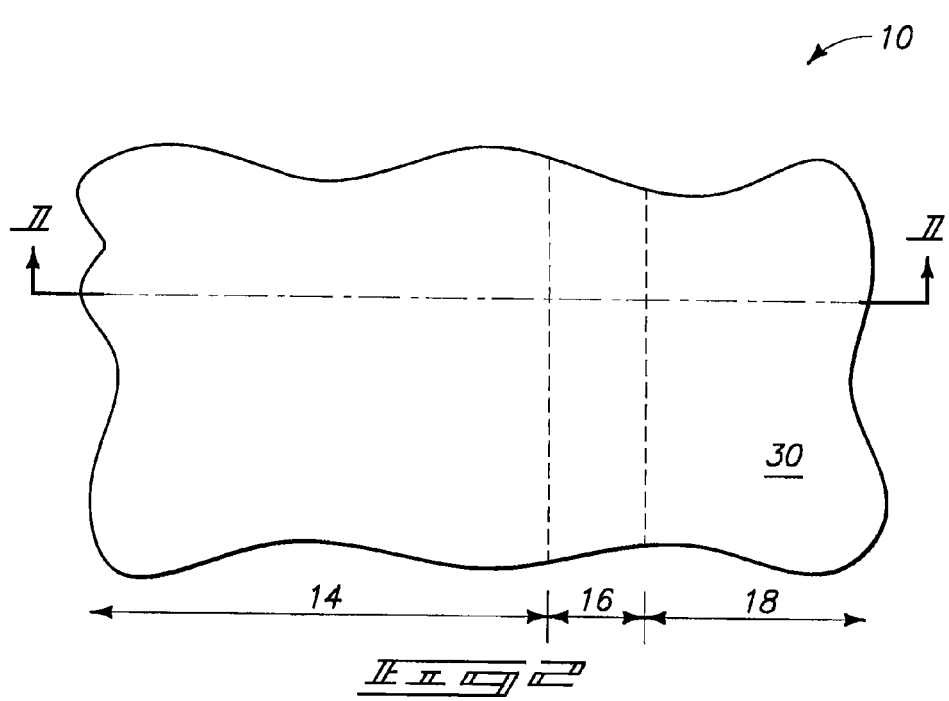
FIG. 2 is a top view of a semiconductor wafer fragment comprising the cross-section of FIG. 1 along the line 1-1.

FIG. 2 shows a top view of a semiconductor wafer fragment comprising the FIG. 1 cross-section, and shows retaining structure 30 extending entirely across the upper surface of the semiconductor construction.

Figure 3:
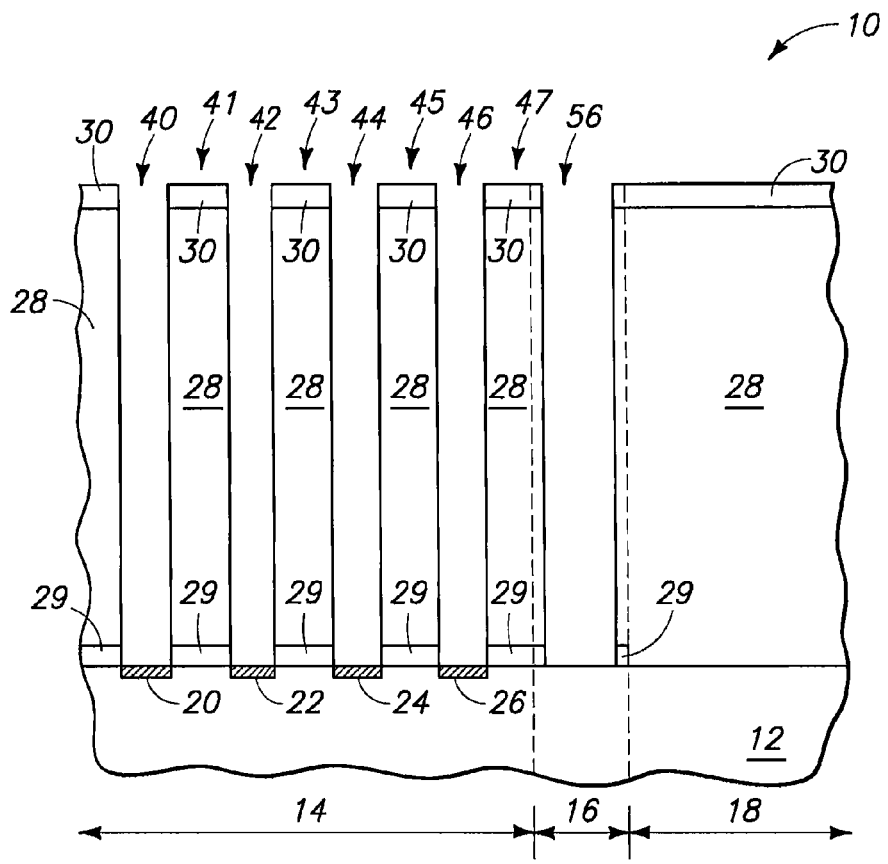
FIG. 3 shows the FIG. 1 wafer fragment at a processing stage subsequent to that of FIG. 1.
Figure 4:
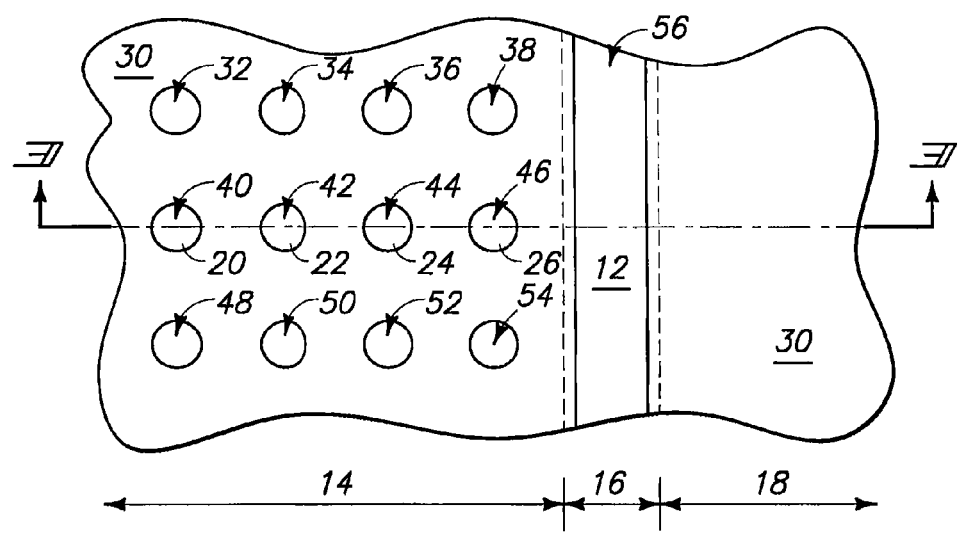
FIG. 4 is a top view of a semiconductor construction comprising the fragment of FIG. 3 along the line 3-3.

Referring next to FIGS. 3 and 4, openings 32, 34, 36, 38, 40, 42, 44, 46, 48, 50, 52 and 54 are formed through retaining structure 30, material 28, material 29, and to the node locations associated with an upper surface of substrate 12, (with the node locations 20, 22, 24 and 26 being shown in FIG. 3). The openings can each have a very high aspect ratio, and ultimately are utilized for forming capacitor containers (as discussed below). In particular aspects, the openings can have an elevation of from about 2 to about 3 microns, and a width of about 0.1 micron. The openings are shown to have circular outer peripheries (as illustrated by the top view of FIG. 4), but it is to be understood that the openings can have other shapes. The openings 32, 34, 36, 38, 40, 42, 44, 46, 48, 50, 52, and 54 are ultimately utilized as locations of capacitor storage nodes, as discussed in more detail below.

The openings 32, 34, 36, 38, 40, 42, 44, 46, 48, 50, 52, and 54 are formed over memory array region 14 of construction 10, and while the openings are formed a trench 56 is formed within location 16 of construction 10. Although trench 56 is shown formed simultaneously with the openings over memory array region 14, and accordingly is shown formed utilizing the same etch as that used to form the openings, it is to be understood that the trench can be, in alternative processing (not shown), formed with an etch separate from that utilized to form the openings over the memory array region. In such aspects, the etch utilized to form the trench can be conducted either prior to, or after, the etch utilized to form the container openings associated with memory array region 14.

The formation of the container openings within memory array region 14 and the trench within location 16 would typically be accomplished by first forming a photoresist mask (not shown) with photolithographic processing, and subsequently transferring a pattern from the patterned mask to underlying materials 28, 29 and 30, followed by removal of the patterned photoresist mask. The photolithographic requirements associated with formation of the patterned mask can be relatively stringent, and accordingly an antireflective layer (not shown) can be incorporated into structure 30, formed beneath structure 30, or formed over structure 30 in various aspects of the present invention. The antireflective coating can comprise, for example, either a hard film (for example, dielectric antireflective coating, (DARC)), or a spin-on film (for example, bottom antireflective coating, (BARC)).

Openings 32, 34, 36, 38, 40, 42, 44, 46, 48, 50, 52 and 54 are formed in an array within memory region 14. Such array comprises rows and columns. The rows can be considered to extend horizontally in the view of FIG. 4, and the columns can be considered to extend vertically in the view of FIG. 4. The retaining material 30 defines segments extending between the openings. Alternatively, it can be considered that openings along one row of the array of openings are spaced from openings along an adjacent row of the array by segments of the retaining material 30; and similarly openings along one column of the array are spaced from openings along an adjacent column by segments of the retaining material 30. Representative segments of material 30 between adjacent columns are labeled as 41, 43, 45 and 47 in the cross-sectional view of FIG. 3.

Referring next to FIGS. 5 and 6, an electrically conductive material 60 is formed within openings 32, 34, 36, 38, 40, 42, 44, 46, 48, 50, 52 and 54, as well as within trench 56. Electrically conductive material 60 can be a homogeneous composition of electrically conductive material, or can comprise multiple layers of electrically conductive material. Accordingly, material 60 can comprise, consist essentially of, or consist of one or more electrically conductive compositions. Any suitable electrically conductive compositions can be utilized within material 60. In exemplary aspects, material 60 can comprise one or more of conductively-doped silicon, metal, and metal compounds. In particular aspects, layer 60 will comprise a layer of titanium nitride over a layer of titanium. The titanium can be processed under appropriate conditions so that the titanium interacts with silicon at the node locations 20, 22, 24 and 26 to form titanium silicide.

Conductive material 60 is ultimately incorporated into a capacitor electrode, and in particular aspects can be incorporated into a capacitor storage node. Accordingly, layer 60 can be referred to as capacitor electrode material, and in particular aspects can be referred to as electrically conductive storage node material.

Conductive material 60 is shown to only partially fill the openings 32, 34, 36, 38, 40, 42, 44, 46, 48, 50, 52 and 54, and thus to form container structures within the openings. For instance, FIG. 5 shows the portions of material 60 within openings 40, 42, 44 and 46 corresponding to container constructions 62, 64, 66 and 68. The container constructions can be considered to comprise inner surfaces 70 within the openings and outer surfaces 72 laterally opposed to the inner surfaces. The outer surfaces 72 extend along materials 28 and 29, as well as along retaining structure 30. The container structures of FIG. 5 form an array co-extensive with the array defined by the openings 32, 34, 36, 38, 40, 42, 44, 46, 48, 50, 52 and 54.

Although material 60 is shown forming container structures, it is to be understood that the material 60 can alternatively form other conductive structures. For instance, in some aspects of the invention (not shown) the conductive material 60, either alone or in combination with other conductive materials, can completely fill the openings to form pedestal (or post) structures within the openings. Such pedestals (or posts) can ultimately be utilized as capacitor storage nodes.

The conductive material 60 is shown being formed over retaining material 30, as well as within the openings. Thus, the conductive material 60 can be considered to cover the segments of the retaining material extending between the openings of the opening array, and in some aspects can be considered to itself form segments extending between the openings of the opening array. Representative segments of material 60 are labeled as 51, 53, 55 and 57 in the cross-sectional view of FIG. 5.

Referring next to FIGS. 7 and 8, a masking material 70 is provided over conductive material 60 and within openings 32, 34, 36, 38, 40, 42, 44, 46, 48, 50, 52 and 54. The masking material is patterned to expose some of the segments of conductive material 60 (for instance, segments 51 and 55 are shown exposed in the cross-sectional view of FIG. 7) while covering other segments (for instance, segments 53 and 57 are covered by the patterned mask material 70). In the shown aspect of the invention, the material 70 also fills trench 56, and covers peripheral region 18.

The patterned mask 70 can comprise any suitable composition, and in particular aspects will comprise photoresist. In such aspects, material 70 can be patterned with photolithographic processing.

The patterned material 70 can be considered to comprise trenches 72 and 74 extending therethrough. The top view of FIG. 8 shows that such trenches extend between adjacent openings of the array comprising openings 32, 34, 36, 38, 40, 42, 44, 46, 48, 50, 52 and 54. In the shown aspect of the invention, the openings along a row of the array (for instance, openings 40, 42, 44 and 46) are connected in pairs by the trenches 72 and 74. Specifically, the openings 40 and 42 are paired by the trench 72, and the openings 44 and 46 are paired by the trench 74.

Various structures are shown in phantom view (i.e., with dashed lines) in FIG. 8 to indicate that such structures are covered by masking material 70. Specifically, trench 56 is shown in phantom view, and covered portions of openings 32, 34, 36, 38, 40, 42, 44, 46, 48, 50, 52 and 54 are shown in phantom view.

Figure 9:
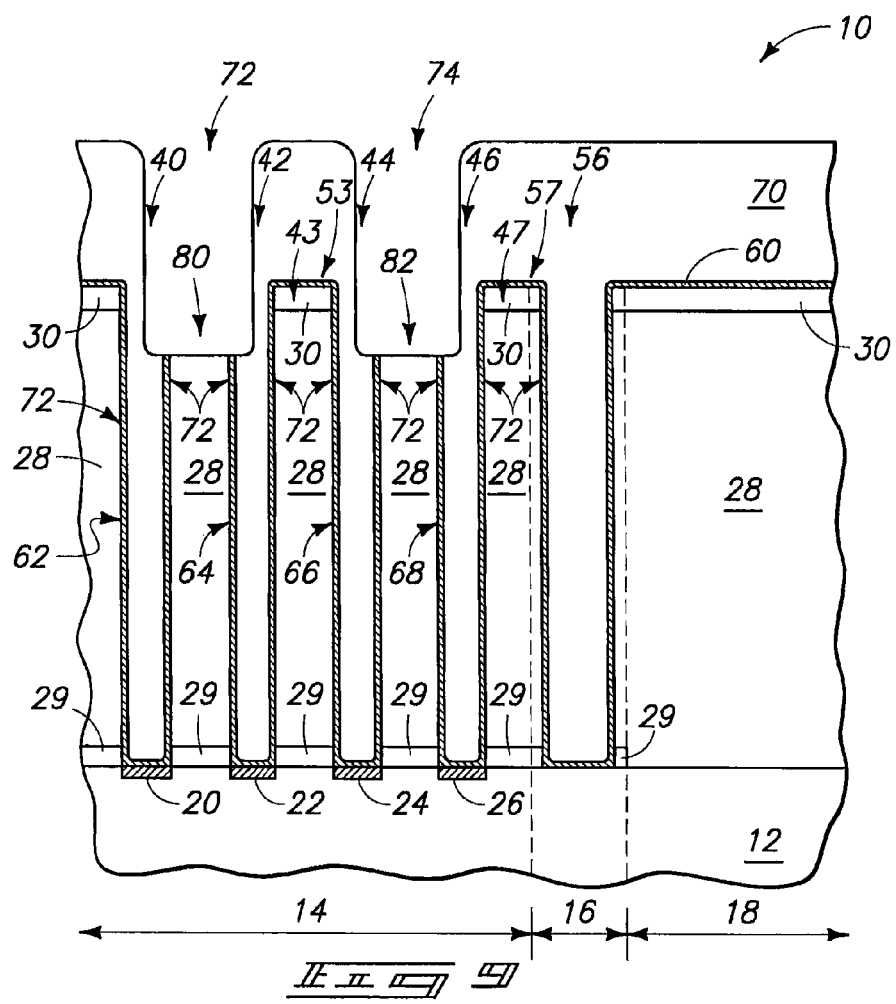
FIG. 9 shows the FIG. 1 wafer fragment at a processing stage subsequent to that of FIG. 7.
Figure 10:
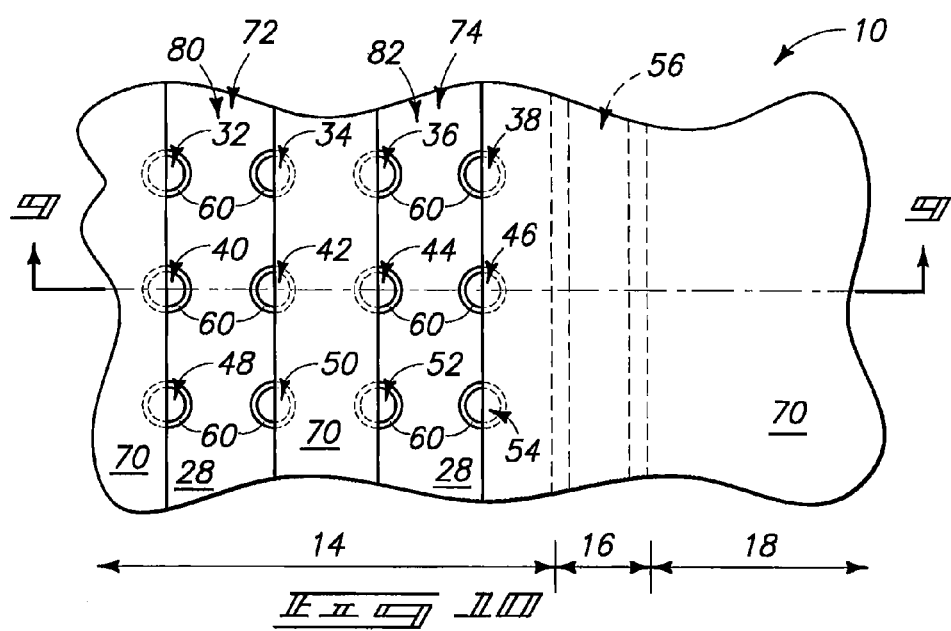
FIG. 10 is a top view of a semiconductor wafer fragment comprising the cross-section of FIG. 9 along the line 9-9.

Referring next to FIGS. 9 and 10, the materials exposed within trenches 72 and 74 are subjected to appropriate etching to remove such materials. Specifically, portions of conductive material 60 exposed within the trenches, portions of retaining structure 30 exposed within the trenches, and portions of material 28 exposed within the trenches are removed with one or more suitable etches. It is noted that portions of material 28 within the trenches will subsequently be removed with another etch, and accordingly such portions may or may not be removed at the processing stage of FIGS. 9 and 10. The etching utilized to remove materials 60 and 30 within trenches 72 and 74 can be any suitable etching. Although the etch is shown removing conductive material 60 to the same level as insulative material 28, it is noted that such is merely one exemplary aspect of the invention, and that the invention encompasses other aspects in which materials 60 and 28 are removed to different levels within the grooves 72 and 74.

The removal of materials 60 and 30 from within trenches 72 and 74 removes the segments 41, 51, 45 and 55 of such materials (FIG. 7) while leaving the segments 43, 53, 47 and 57 of the materials. Such forms apertures, or windows, 80 and 82 extending to first material 28 within the trenches 72 and 74. The apertures extend to alternating pairs of the openings 32, 34, 36, 38, 40, 42, 44, 46, 48, 50, 52 and 54. Specifically, the apertures extend to alternating pairs along rows of the openings, and for example in the shown aspect extend to the pair 40 and 42 and the pair 44 and 46 along a row of the openings shown in the cross-section of FIG. 9. The remaining segments of retaining material 30 and conductive material 60 also extend between alternating pairs of the openings along rows of the openings. For instance, in the cross-section of FIG. 9 the remaining segments 43, 53, 47 and 57 of materials 30 and 60 extend between pairs 42 and 44, and 44 and 46 of the openings along the row of openings that extends across the cross-section of FIG. 9.

In some aspects, the conductive material 60 within the openings 32, 34, 36, 38, 40, 42, 44, 46, 48, 50, 52 and 54 can be considered to form an array of container structures within the array of openings. In such aspects, the remaining segments of materials 30 and 60 can be considered to connect alternating pairs along rows of the container structure array.

Various structures are shown in phantom view (i.e., with dashed lines) in FIG. 10 to indicate that such structures are covered by masking material 70. Specifically, trench 56 is shown in phantom view, and covered portions of openings 32, 34, 36, 38, 40, 42, 44, 46, 48, 50, 52 and 54 are shown in phantom view.

Referring next to FIGS. 11 and 12, first material 28 across the memory array region (FIGS. 9 and 10) is removed with an etch selective for the first material relative to the conductive material 60, retaining structure 30, and etch stop material 29. The material 28 is removed by etching material through the apertures (or windows) 80 and 82. Such removal can be accomplished by an isotropic etch so that the etchant migrates under and around retaining structure 30 and conductive material 60 to remove substantially all of the first material 28 from across the memory array region 14. If first material 28 comprises PSG, an exemplary isotropic etch can utilize hydrofluoric acid or hydrofluoric acid in combination with acetic acid.

Masking material 70 (FIGS. 9 and 10) is removed at the processing stage of FIGS. 11 and 12. The masking material can be removed either before or after the isotropic etch utilized to remove first material 28. Typically, the masking material will be removed before the isotropic etch, and the conductive material 60 in combination with retaining structure 30 will be utilized to protect material 28 within the peripheral region 18 from being removed during the isotropic etch.

It can be advantageous to have conductive material 60 protecting the peripheral region in addition to the retaining structure 30. The retaining structure may have some pinholes or other defects. The conductive material 60 can provide an additional layer of protection so that isotropic etching conditions do not penetrate into the peripheral region through such defects during removal of material 28 across the memory array region. Prior art processes would not have had the layer 60 over retaining structure 30 during an isotropic etch analogous to the etch of FIGS. 11 and 12. Inclusion of the layer 60 over material 30 in aspects of the present invention can advantageously enable material 30 to be formed thinner than in prior art processes. An additional advantage of having layer 60 over material 30 during the isotropic etch of material 28, is that such can make it easier to use silicon nitride alone for material 30, rather than silicon nitride in combination with silicon. Specifically, one of the reasons for using silicon in combination with silicon nitride for material 30 was to have the silicon form a barrier across defects that may be present in the silicon nitride. The present invention can advantageously utilize the material 60 as such barrier.

The removal of first material 28 from across the memory array region exposes outer surfaces 72 of the container construction 62, 64, 66 and 68. Accordingly, such container constructions have both the outer surfaces 72 and the inner surfaces 70 exposed for subsequent processing. In the shown aspect of the invention, only portions of the outer surfaces 72 are exposed, while some portions remain covered by etch stop material 29 and retaining structure 30. Also, although the shown aspect has all of the material 28 removed from along the outer portions 72, it is to be understood that the invention also encompasses aspects in which only some of the material 28 is removed during the etching through the apertures 80 and 82.

Referring next to FIGS. 13 and 14, conductive material 60 is removed from over retaining structure 30. In the shown aspect of the invention, the conductive material is removed from over the retaining structure across the peripheral region, as well as being removed from over the memory array region. However, it is to be understood that the invention can also include aspects in which the conductive material 60 is only removed from over the retaining structure across the memory array region.

The removal of conductive material 60 can be conducted with any suitable processing. In particular aspects, the conductive material 60 over retaining structure 30 at the processing stage of FIGS. 11 and 12 comprises a layer of titanium nitride over a layer of titanium. In such aspects, the removal of conductive material 60 can be accomplished with a dry etch of the titanium nitride and titanium. Since the container structures 62, 64, 66 and 68 are very deep, the dry etch does not penetrate significantly into the containers. In other aspects, chemical-mechanical polishing can be utilized to remove conductive material 40. However, it can be advantageous to utilize a dry etch instead of chemical-mechanical polishing in that the dry etch can be accomplished with lower cost than chemical-mechanical polishing.

Figure 15:
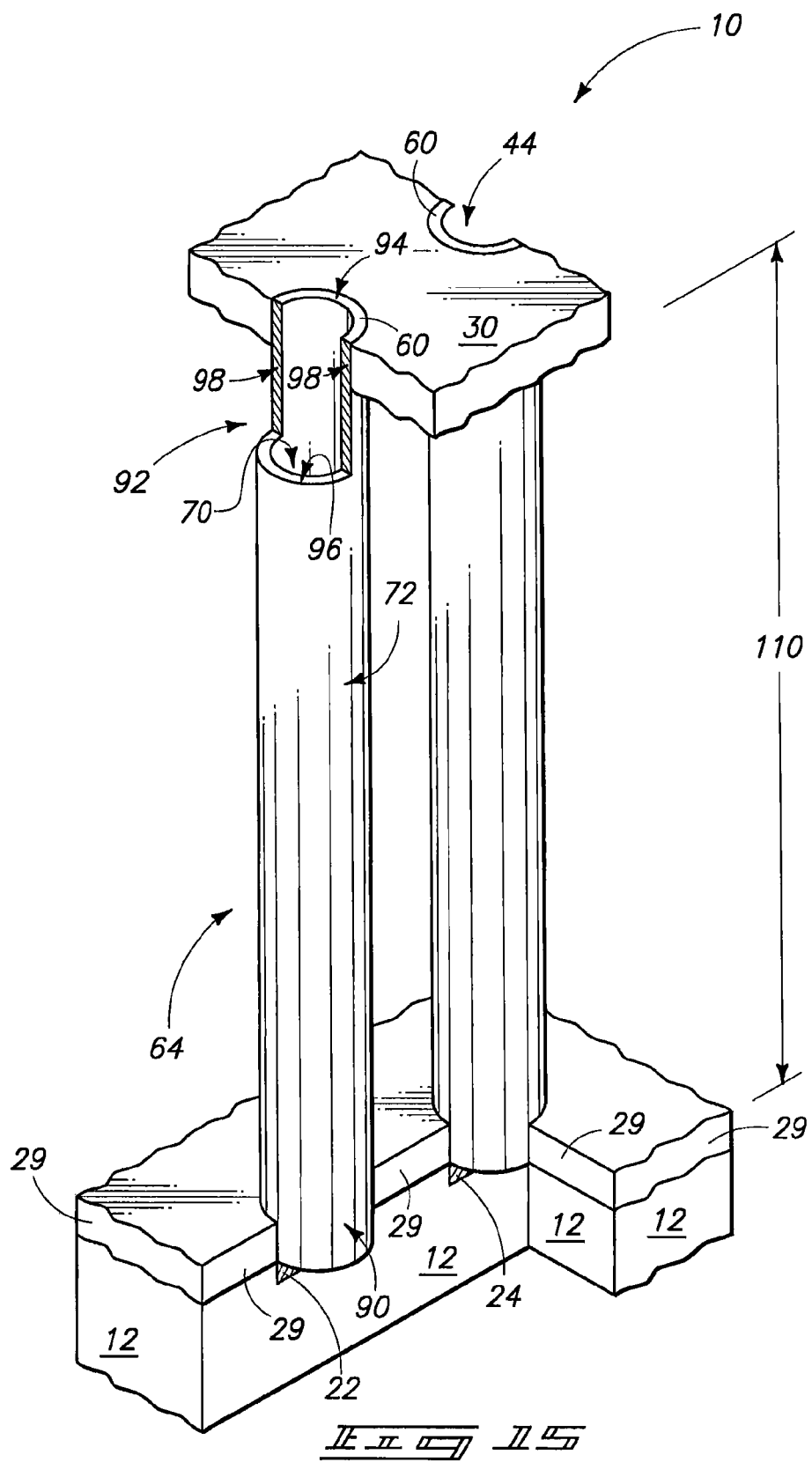
FIG. 15 is an expanded three-dimensional view of a region labeled 15 in FIGS. 13 and 14.

The processing of the present invention forms capacitor storage nodes having an unusual shape. FIG. 15 shows an expanded region 15 of the construction of FIGS. 13 and 14, and specifically shows a three-dimensional view of the storage node structure 64. The storage node structure is shown to comprise a first end 90 proximate the substrate 12, and a second end 92 in opposing relation to the first end. The second end is shown to be partially cut-away by the processing of FIGS. 9 and 10 (which formed the windows 80 and 82 of FIGS. 9 and 10). Specifically, the second end 92 has an upper portion 94, a lower portion 96, and a step 98 which connects the upper and lower portions to one another. The retaining structure 30 is against the upper portion 94, and not against the lower portion 96 of the second end 92.

In the shown aspect of the invention, the storage node 64 is a container-shaped storage node, and accordingly has a hollow interior region. The particular shape of the capacitor storage node is a hollow tube, with such tube having an outer surface 72 along its exterior, and an inner surface 70 along its interior. The second end 92 of such tube is round. The shown upper portion 94 comprises about one-half of such round second end, while the lower portion 96 comprises the other half of such round second end. It is to be understood, however, that the tube can have any suitable shape, including, for example, an elliptical shape. Further, it is to be understood that although the shown storage node is a container-type node, the invention can also be utilized for forming pedestal (or post) type nodes. In aspects of forming pedestal-type nodes, the node 64 would be solid, rather than hollow. However, the node could still comprise the an upper end having a shape analogous to the shown shape of the upper end (the so-called second end 92) in which an upper portion 94 is joined to a lower portion 96 by a step 98, and in which only the upper portion 94 is against the retaining structure 30.

All of the storage nodes formed across the memory array region can be substantially identical to one another, and accordingly can have shapes corresponding to the shape shown in FIG. 15 for the storage node 64.

In the shown aspect of the invention, the lower end 90 is within the electrically insulative material 29. The semiconductor substrate 12 will comprise a semiconductive material, and in particular aspects the node location 22 can correspond to a conductively-doped diffusion region within such semiconductor material. The electrically insulative material 29 can be considered to be over the semiconductive material of substrate 12 and around a lower region of storage node 64.

A lowermost surface of retaining structure 30 is above an uppermost surface of insulative material 29 by a distance 110. Such distance corresponds to the thickness of the material 28 at the processing stage of FIG. 1, and can, for example, be a distance of at least about 5,000 Å, and in particular aspects will be a distance of at least about 8,000 Å, or even a distance of at least about 10,000 Å. Further, as is apparent from the illustration of FIG. 15, the distance between the lowermost surface of retaining structure 30 and the uppermost surface of substrate 12 is at least as great as the distance 110 between the lowermost surface of retaining structure 30 and the uppermost surface of insulative material 29, and accordingly can be at least about 5,000 Å, at least about 8,000 Å, or even at least about 10,000 Å, in various aspects of the invention.

Referring next to FIGS. 16 and 17, dielectric material 120 is formed over retaining structure 30 and within openings 32, 34, 36, 38, 40, 42, 44, 46, 48, 50, 52 and 54, as well as within trench 56. Subsequently, conductive material 122 is formed over the dielectric material and within the openings 32, 34, 36, 38, 40, 42, 44, 46, 48, 50, 52 and 54, as well as within the trench 56. The conductive material 122 forms a capacitor plate, and the dielectric material 120 forms capacitor dielectric so that a plurality of capacitor constructions 132, 134, 136, 138, 140, 142, 144, 146, 148, 150, 152 and 154 are formed within the openings 32, 34, 36, 38, 40, 42, 44, 46, 48, 50, 52 and 54, respectively. Each of the capacitor constructions comprises one of the storage nodes discussed previously, in combination with the dielectric material and capacitor plate material. The storage nodes discussed previously have thus incorporated into a plurality of capacitor devices.

Dielectric material 120 can comprise any suitable composition or combination of compositions, and in particular aspects will comprise, consist essentially of, or consist of one or both of silicon dioxide and silicon nitride.

Capacitor plate material 122 can comprise any suitable composition or combination of compositions, and in particular aspects will comprise conductively-doped semiconductor material (such as, for example, conductively-doped silicon), metal (such as, for example, titanium or tungsten), and/or metal compounds (such as, for example, titanium silicide, titanium nitride, titanium nitride and tungsten nitride).

In some aspects, the conductive material 60 can be referred to as a first conductive material, and the conductive material 122 can be referred to as a second conductive material formed over and capacitively coupled with the first conductive material. Alternatively, the conductive materials 60 and 122 can be considered to comprise one or more conductive layers, and any conductive layer of material 60 can be referred to as a first conductive layer while any layer of conductive material 122 can be referred to as a second conductive layer.

The dielectric material 120 and conductive material 122 will extend around and within the storage node tubes of the type shown in three dimensions in FIG. 15. Specifically, the capacitor dielectric material is along and against exposed surfaces of the outer walls 72 and inner walls 70.

The openings 32, 34, 36, 38, 40, 42, 44, 46, 48, 50, 52 and 54, as well as the trench 56, are shown in phantom view in FIG. 17 to indicate that such are beneath the conductive material 122.

The aspect of the invention of FIGS. 13-17 has conductive material 60 removed from over retaining structure 30 prior to formation of dielectric material 120 and conductive material 122. It is to be understood, however, that the invention also encompasses aspects in which the conductive material 60 remains over retaining structure 30 during formation of dielectric material 120 and conductive material 122, and then subsequently is removed together with some of the dielectric material 120 and conductive material 122. Such aspect is discussed with reference to FIGS. 18-21.

Referring to FIGS. 18 and 19, construction 10 is shown at a processing stage subsequent to that of FIG. 11. Specifically, dielectric material 120 and conductive material 122 have been formed over conductive material 60, as well as within the openings 32, 34, 36, 38, 40, 42, 44, 46, 48, 50, 52 and 54, and within the trench 56. Individual capacitor devices are not yet defined, in that all of the storage nodes ultimately formed with conductive material 60 are shorted together at the processing stage of FIGS. 18 and 19.

The openings 32, 34, 36, 38, 40, 42, 44, 46, 48, 50, 52 and 54, as well as the trench 56, are shown in phantom view in FIG. 19 to indicate that such are beneath the conductive material 122.

Figure 20:
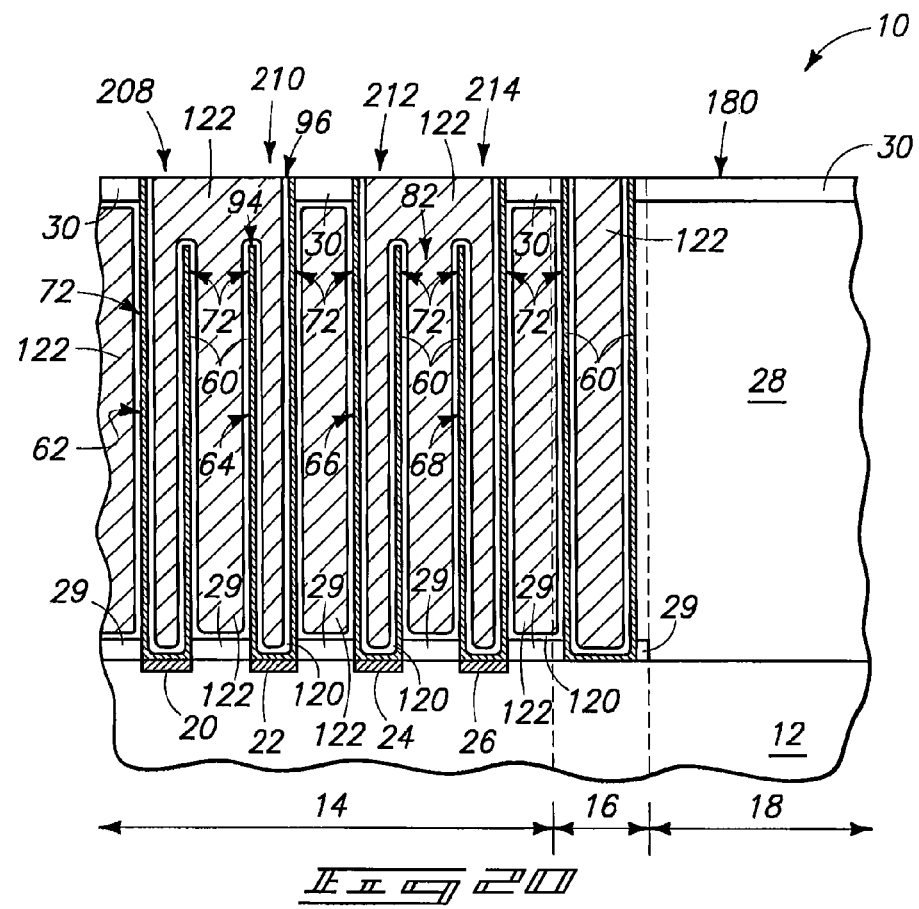
FIG. 20 shows the FIG. 18 wafer fragment at a processing stage subsequent to that of FIG. 18.
Figure 21:
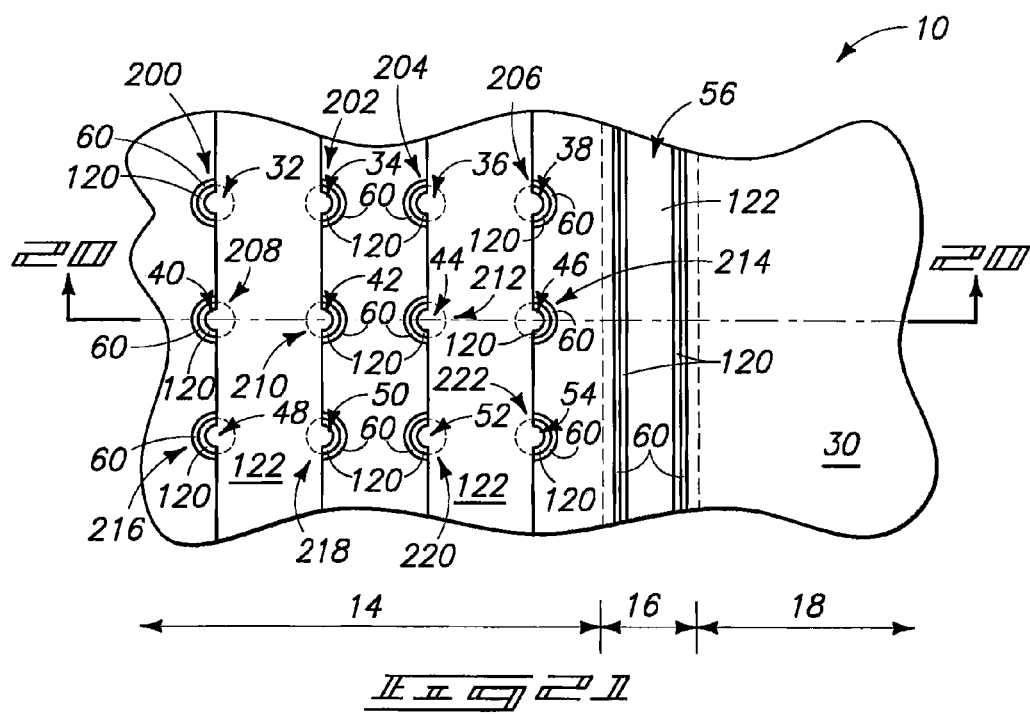
FIG. 21 is a top view of a semiconductor wafer fragment comprising the cross-section of FIG. 20 along the line 20-20.

FIGS. 20 and 21 show construction 10 after it has been subjected to suitable processing to remove materials 60, 120 and 122 from over retaining structure 30. Such processing can comprise, for example, chemical-mechanical polishing to form a planarized upper surface 180. Such also forms capacitor constructions 200, 202, 204, 206, 208, 210, 212, 214, 216, 218, 220 and 222 from the first conductive material 60, dielectric material 120 and second conductive material 122.

As discussed previously, retaining structure 30 and conductive material 60 can be considered to comprise segments extending between openings 32, 34, 36, 38, 40, 42, 44, 46, 48, 50, 52 and 54 at the processing stage of FIGS. 5 and 6. In some aspects, the methodology of FIGS. 13-17 can be considered to comprise removal of the segments of conductive material 60 from over the segments of retaining structure 30 prior to formation of the capacitor dielectric material 120 and capacitor plate material 122; whereas the processing of FIGS. 18-21 can be considered to comprising removal of the segments of conductive material 60 from over the segments of retaining structure 30 after formation of the capacitor dielectric material 120 and capacitor plate material 122.

A difference between the capacitors formed with the processing of FIGS. 13-17 (in other words, the capacitors shown in FIGS. 16 and 17) relative to the capacitors formed with the processing of FIGS. 18-21 (in other words, the capacitors shown in FIGS. 20 and 21) is that the capacitors formed with the processing of FIGS. 13-17 will have conductive material 122 extending over both the upper and lower portions of the upper ends of the storage nodes (in other words, the upper portion 94 and lower portion 96 shown in FIG. 15), while the processing of FIGS. 18-21 forms capacitors which have the conductive material 122 over the lower portions of the uppermost ends of the storage nodes (the portions 96 of FIG. 15) and not over the upper portions of such ends (the portions 94). Thus, conductive material 122 can be seen to be directly over the lower portion 94 of the upper end of storage node 64, and not directly over the upper portion 96 of such upper end of the storage node 64 at the processing stage of FIG. 20.

The capacitor constructions of the present invention can be incorporated into memory arrays by coupling such capacitor constructions with transistor devices. For instance, node locations 20, 22, 24 and 26 can correspond to conductively-doped diffusion regions which are source/drain regions of transistor devices. As is known by persons of ordinary skill in the art, a capacitor coupled with a transistor forms a dynamic random access memory (DRAM) cell. Accordingly, the capacitor array formed in accordance with the methodology of the present invention can be incorporated into a memory array, and then utilized in various electronic systems.

FIG. 22 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 23. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 24:
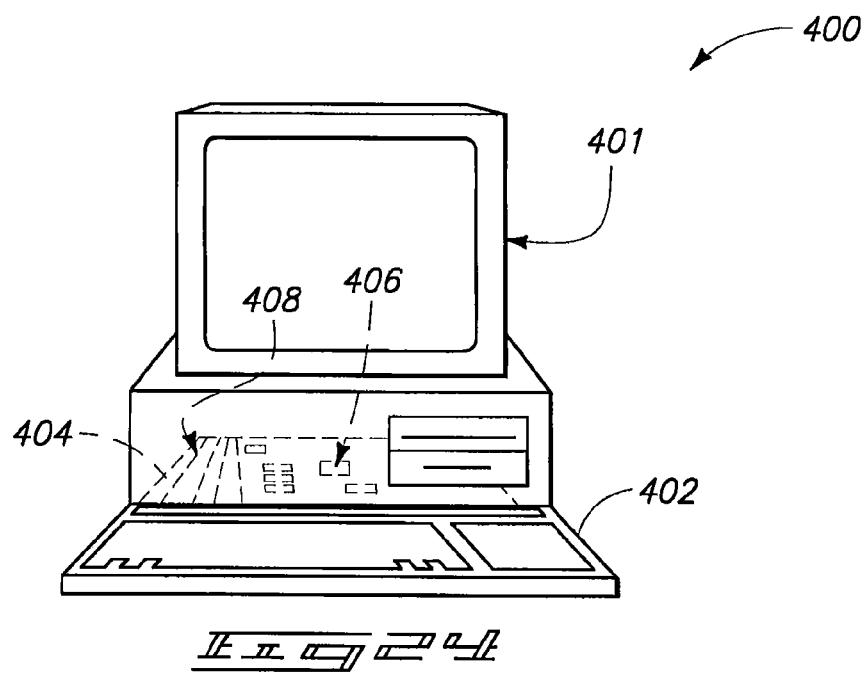
FIG. 24 is a high level block diagram of an electronic system according to an exemplary aspect of the present invention.

FIG. 24 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 25:
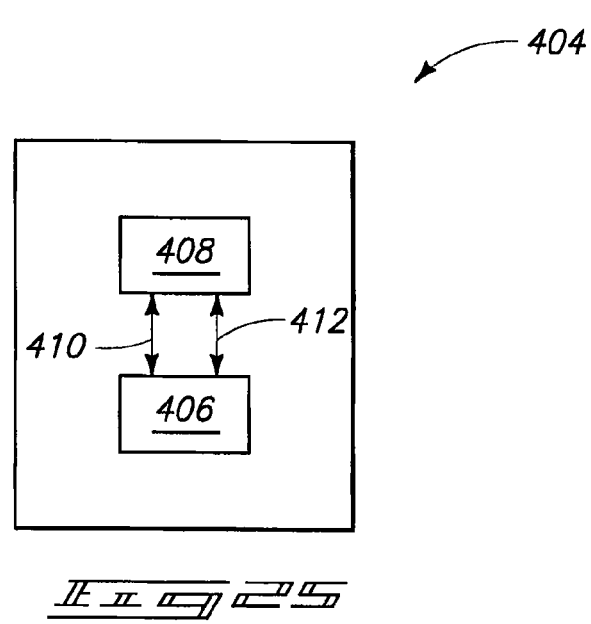
FIG. 25 is a simplified block diagram of an exemplary memory device according to an aspect of the present invention.

FIG. 25 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a semiconductor substrate;
   a capacitor storage node supported by the substrate, the storage node having a first end proximate the substrate and a second end in opposing relation to the first end; the second end having an upper portion, a lower portion below the upper portion, and a step connecting the upper and lower portions to one another;
   a retaining structure against the upper portion of the second end and not against the lower portion of the second end;
   a dielectric material along the storage node;
   an electrically conductive material over the dielectric material and capacitively connected with the storage node; and
   wherein:
      the second end of the storage node is round;
      the upper portion of the second end comprises half of the round second end; and
      the lower portion of the second end comprises an opposing half of the round second end relative to the upper portion.

2. The construction of claim 1 wherein the substrate has an uppermost surface, the retaining structure has a lowermost surface, and the lowermost surface of the retaining structure is spaced from the uppermost surface of the substrate by at least about 5,000 Å.

3. The construction of claim 2 further comprising an electrically insulative material over the substrate and around a lower region of the storage node; and wherein said electrically insulative material comprises an uppermost surface that is spaced from the lowermost surface of the retaining structure by at least about 5,000 Å.

4. The construction of claim 3 wherein the electrically insulative material consists essentially of one or both of undoped silicate glass and silicon nitride.

5. The construction of claim 1 wherein the storage node comprises titanium nitride.

6. The construction of claim 1 wherein the storage node comprises a layer of titanium nitride and a layer of titanium.

7. The construction of claim 1 wherein the retaining structure comprises silicon nitride.

8. The construction of claim 1 wherein the electrically conductive material is directly over both of the upper and lower portions of the second end.

9. The construction of claim 1 wherein the electrically conductive material is directly over the lower portion of the second end, and is not directly over the upper portion of the second end.

10. The construction of claim 1 wherein:

the capacitor storage node is shaped as a hollow tube; said tube having an inner surface along its interior and an outer surface along its exterior;

the dielectric material is along the inner and outer surfaces of the tube; and the electrically conductive material is within the tube as well as around the outer surfaces of the tube.

11. The construction of claim 10 wherein the electrically conductive material is directly over both of the upper and lower portions of the second end.

12. The construction of claim 10 wherein the electrically conductive material is directly over the lower portion of the second end, and is not directly over the upper portion of the second end.

13. An electronic system, comprising:

a processor;

a memory device in data communication with the processor; and wherein at least one of the processor and the memory device comprises a plurality of capacitors, the capacitors being in an assembly comprising:

capacitor storage nodes shaped as hollow tubes extending upwardly from a substrate, the tubes having first ends proximate the substrate and second ends in opposing relation to the first ends; the second ends having upper portions, lower portions below the upper portions, and steps connecting the upper and lower portions to one another; the tubes having inner surfaces along their interiors and outer surfaces along their exteriors; the tubes extending in an array comprising rows and columns;

retaining structures against the upper portions of the second ends and not against the lower portion of the second ends; the retaining structures extending between and connecting alternating pairs along the rows of storage nodes of the array;

a dielectric material along the inner and outer surfaces of the tubes; and an electrically conductive material over the dielectric material and capacitively connected with the storage nodes.

14. The electronic system of claim 13 wherein:

the second ends of the storage nodes have round peripheries;

the upper portions of the second ends comprise about one-half of the round peripheries of the second ends; and the lower portions of the second end comprise about one-half of the round peripheries of the second ends.

15. The electronic system of claim 13 wherein the storage nodes comprise titanium nitride.

16. The electronic system of claim 13 wherein the retaining structures comprise silicon nitride.

17. The electronic system of claim 13 wherein the electrically conductive material is directly over both of the upper and lower portions of the second ends.

18. The electronic system of claim 13 wherein the electrically conductive material is directly over the lower portions of the second ends, and is not directly over the upper portions of the second ends.

19. A semiconductor construction, comprising:

a semiconductor substrate;

a capacitor storage node supported by the substrate, the storage node being shaped as a hollow tube extending upwardly from the substrate, the tube having a first end proximate the substrate and a second end in opposing relation to the first end; the second end having an upper portion, a lower portion below the upper portion, and a step connecting the upper and lower portions to one another; the tube having an inner surface along an interior and an outer surface along an exterior;

a retaining structure against the upper portion of the second end and not against the lower portion of the second end;

a dielectric material along the inner and outer surfaces of the tube, the dielectric material being in physical contact with the inner and outer surfaces of the upper and lower portions of the second end;

an electrically conductive material along the inner and outer surfaces of the tube and over the dielectric material and in direct physical contact with the dielectric material and capacitively connected with the storage node, the electrically conductive material being capacitively connected with both the inner and outer surfaces of the upper and lower portions of the second end;

wherein, the second end of the storage node has a round periphery;

the upper portion of the second end comprises half of the round periphery of the second end; and the lower portion of the second end comprises an opposing half of the round periphery of the second end relative to the upper portion of the second end.

20. An electronic system comprising the semiconductor construction of claim 19.

* * * * *